(12) United States Patent
Liao et al.

(10) Patent No.: US 6,783,052 B2
(45) Date of Patent: Aug. 31, 2004

(54) CLAMP ACTUATION MECHANISM

(75) Inventors: You Yong Liao, Singapore (SG); Ajit Gaunekar, Singapore (SG); Gary Peter Widdowson, Hong Kong (CN)

(73) Assignee: ASM Technology Singapore PTE LTD, Singapore (SG)

( * ) Notice: Subject to any disclaimer, the term of this patent is extended or adjusted under 35 U.S.C. 154(b) by 83 days.

(21) Appl. No.: 10/303,322

(22) Filed: Nov. 21, 2002

(65) Prior Publication Data

US 2004/0099711 A1 May 27, 2004

(51) Int. Cl.$^7$ .............................................. B23K 37/053
(52) U.S. Cl. ...................................... 228/4.5; 228/44.7
(58) Field of Search ....................... 228/1.1, 4.5, 44.3, 228/44.7, 49.5, 47.1, 110.1, 212, 213, 180.5; 269/48.1, 91, 92, 216

(56) References Cited

U.S. PATENT DOCUMENTS

| | | | | |
|---|---|---|---|---|
| 3,699,635 A | * | 10/1972 | Bradley et al. ............... 29/252 |
| 3,756,556 A | * | 9/1973 | Georgi ............................ 251/7 |
| 5,901,896 A | * | 5/1999 | Gal ............................. 228/4.5 |
| 2001/0024419 A1 | * | 9/2001 | Oowaki et al. ............. 369/271 |
| 2002/0063144 A1 | * | 5/2002 | Yamaguchi et al. ......... 228/4.5 |

* cited by examiner

*Primary Examiner*—Kiley Stoner
*Assistant Examiner*—Jonathan Johnson
(74) *Attorney, Agent, or Firm*—Ostrolenk, Faber, Gerb & Soffen, LLP

(57) ABSTRACT

The invention provides an apparatus and method for clamping an object. The apparatus comprises a clamping mechanism and an actuation system to actuate clamping and de-clamping of the clamping mechanism, wherein the actuation system comprises two actuator devices which are operatively coupled whereby to provide an actuation force to the clamping mechanism. Preferably, the actuator devices comprises a variable reluctance actuator and a linear induction actuator coupled together and adapted to cooperate to provide the actuation force to the clamping mechanism.

16 Claims, 4 Drawing Sheets

CLAMP ACTUATION MECHANISM

The invention relates to an actuation device to actuate a clamping mechanism to clamp objects such as semiconductor substrates. The clamp may be used in an indexing system of a wire bonding machine, in particular a gold wire bonding machine forming electrical connections between semiconductor dies and leadframes, but is capable of wider application.

BACKGROUND AND PRIOR ART

In back-end semiconductor assembly processes, thermosonic ball bonding is by far the most demanding. To make an interconnect between a semiconductor device (commonly called "die") and its substrate ("leadframe"), very thin wire, commonly gold wire of between 20 to 75 microns in diameter, is bonded, first onto a pad on the die and then onto the corresponding lead of the lead-frame on which the die is mounted. This process continues until all the pads and corresponding leads are connected. One leadframe may have anywhere from less than ten to a few tens of dies. In order to bring successive dies into a bonding area, a linear indexing system ("indexer"), is often used to index the leadframe with high precision. The indexer may essentially comprise a horizontal linear motor driven servo controlled stage on which are mounted two index clamps, one each for indexing leadframes near the input and output sections of a wire bonding machine respectively. Each index clamp has an actuator to control the clamping and de-clamping of the leadframe.

As requirements of both speed and accuracy of wire bonding grow more stringent, all critical subsystems of the wire bonding machine, including the indexer and the index clamp need to be made increasingly more robust, reliable and accurate. For the index clamp, this translates to a requirement of higher clamping force without undue increase in clamp mass. A clamping force of 40N may be required for the clamp for which the cycle time can vary anywhere from 2 to 60 seconds, depending upon the die size which in turn determines the number and length of the wires to be bonded. Correspondingly, the duty cycle can vary widely from 10 to 80%. This is so because at times, the index clamp needs to remain clamped near an already bonded semiconductor package even as bonding takes place on another die which is upstream on the same leadframe. This helps to guard against any possible damage to the already bonded wires due to strong vibrations of the work-holder during the bonding process.

Another requirement of the index clamp is that both its upper and lower jaws should preferably be actuated during the clamping and de-clamping actions. In earlier generation wire bonding machines, even as a leadframe was passed through the work-holder channels, it always rested on the lower jaw of the index clamp. Only the upper jaw was kept movable in order to effect the clamping action. The difficulties that arise due to such a clamp that only actuates a single jaw will be described in more detail below with reference to the prior art.

A conventional solenoid actuated clamp is generally of the type shown in FIG. 1. It consists of a fixed solenoid 14 and a solenoid plate 15 mounted on a lever 16, which is free to rotate about a pivot 17. When the solenoid 14 is energized with an electric current, it attracts the solenoid plate 15. This rotates the lever 16 as shown by arrow C, about pivot 17. A jaw 18 mounted on the lever 16 thus rotates as shown by arrow D and clamps the substrate 19 against a fixed lower jaw 20. De-clamping of the substrate 19 is effected by turning off the solenoid current, whereat a return spring 21 which was compressed during the clamping action, rotates the lever 16 in a direction opposite to arrow C leading to the opening of jaw 18. The clamp described above is meant for use in the indexing system of a wire bonding machine but can find application in other machines as well. After clamping the substrate 19, the clamp and substrate 19 are moved in a direction perpendicular to the plane of FIG. 1 using either a linear motor or rotary motor with a rotary-to-linear transmission system such as a ball-screw or lead-screw.

There are several drawbacks of this design. First, since the solenoid 14 is a highly non-linear device, its force increases rapidly as the solenoid plate 15 approaches the solenoid 14. This leads to an undesirably high impact on the substrate 19 during clamping. Secondly, since the force falls off rapidly with an increase in the gap between the solenoid 14 and solenoid plate 15, there is a limit to the stroke of the plate displacement and thus a limit to the range of thickness of substrates which can be clamped.

Thirdly, the prior art affords no active control during de-clamping, but has to depend upon the return spring 21. In order to enable quick de-clamping action, the spring force has to be fairly high. This consumes part of the solenoid force, thus leading to a smaller clamping force than would have been possible without the spring 21. Thus, in order to effect a required level of clamping force, the solenoid 14 has to be larger in size.

Fourthly, since only the upper jaw 18 is moved in the clamping process, the lower jaw 20 has to be located precisely such that the substrate 19 rests on the lower jaw 20 even as the substrate 19 is supported by the fixed channel 33. After clamping, the substrate 19 is indexed precisely through a specified distance in a direction perpendicular to the plane of FIG. 1 after which the upper jaw 18 is moved up thus de-clamping the substrate 19. The indexing actuator then returns with the clamp to the initial position for the next indexing stroke. However during the return stroke, the friction between the substrate 19 and the lower jaw 20 on which the former rests, may disturb the precisely-determined position of the substrate 19. To prevent this from happening it is necessary to use another fixed clamp (not shown) which clamps onto the substrate 19 in this precisely-determined position even as the index clamp returns to its initial position for the next indexing stroke. This increases complexity of the system and consumes more space.

SUMMARY OF THE INVENTION

It is an object of the invention to seek to provide an improved clamp apparatus that can overcome some of the problems identified with the prior art.

According to a first aspect the invention provides an apparatus for clamping an object, comprising a clamping mechanism and an actuation system to actuate clamping and de-clamping of the clamping mechanism, wherein the actuation system comprises two actuator devices which are operatively coupled whereby to provide an actuation force to the clamping mechanism.

According to a second aspect the invention provides a method for clamping an object, comprising providing a clamping mechanism, providing an actuation system to actuate clamping and de-clamping of the clamping mechanism, wherein the step of providing the actuation system comprises providing two actuator devices which are operatively coupled whereby to provide an actuation force to the clamping mechanism.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT

Figure 2:
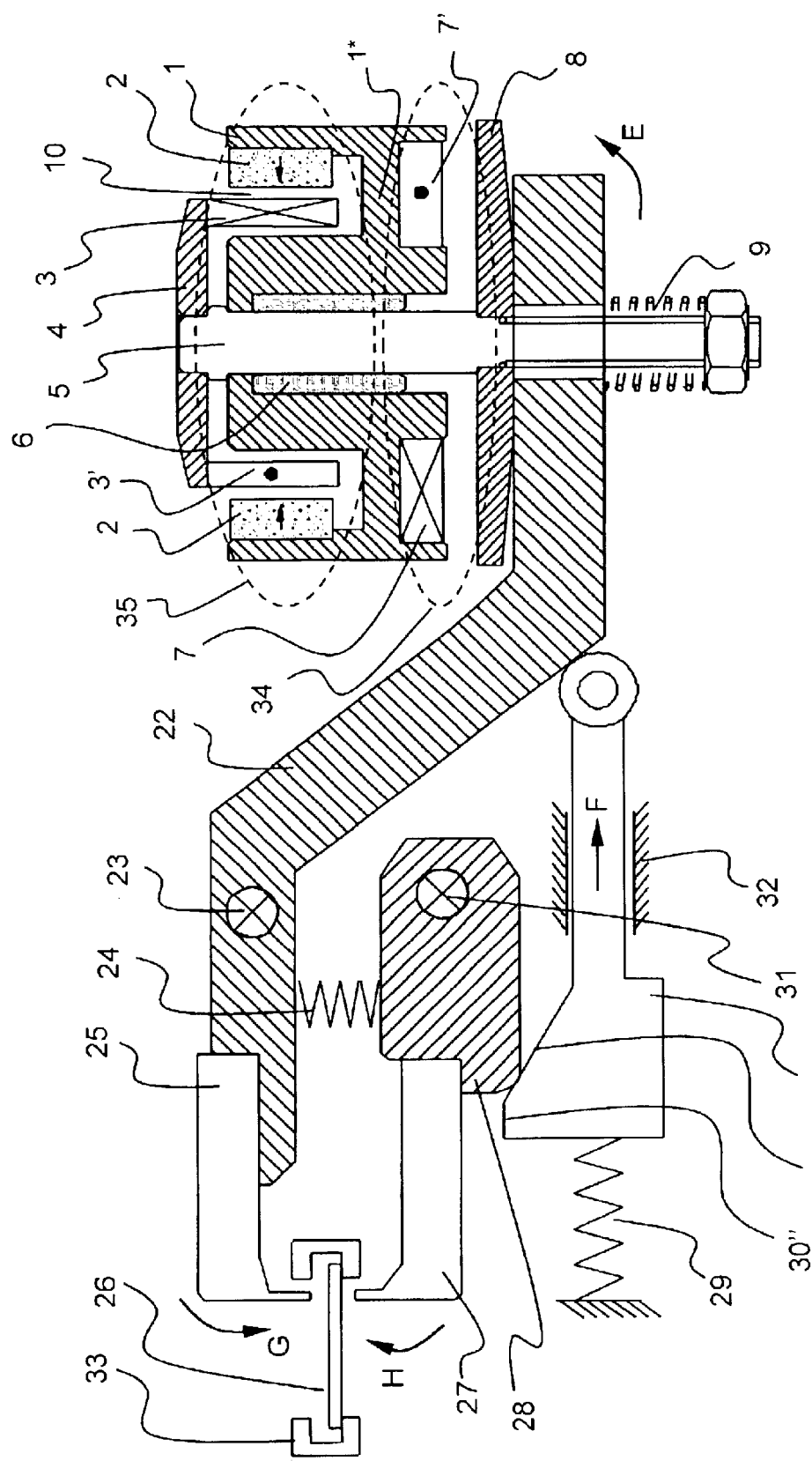
FIG. 2 shows a schematic structure of a clamp apparatus according to the preferred embodiment of the present invention.

Referring to the drawings, FIG. 2 shows a schematic structure of a clamp apparatus according to the preferred embodiment of the present invention. Clamping action of a clamping mechanism of the apparatus is effected by an actuation system, in the form of two actuator devices which are operatively coupled and which comprise a variable reluctance actuator, such as a solenoid motor 34, and a linear induction actuator such as a cylindrical voice-coil motor ("VCM") 35 acting in tandem. The force-gap characteristic of a typical solenoid is highly non-linear, with force dropping off rapidly with increase in the gap between a fixed core and a movable plunger. This steep force attenuation limits the range of leadframe thickness that the clamp can handle. The inclusion of a VCM 35 in the clamp apparatus cooperating with the solenoid motor 34 facilitates movement of the plunger regardless of the solenoid gap. In other words, the motion of the plunger is effected essentially by the VCM 35 while the actual clamping force is essentially provided by both the solenoid motor 34 (which provides a major contribution) and the VCM 35.

Figure 1:
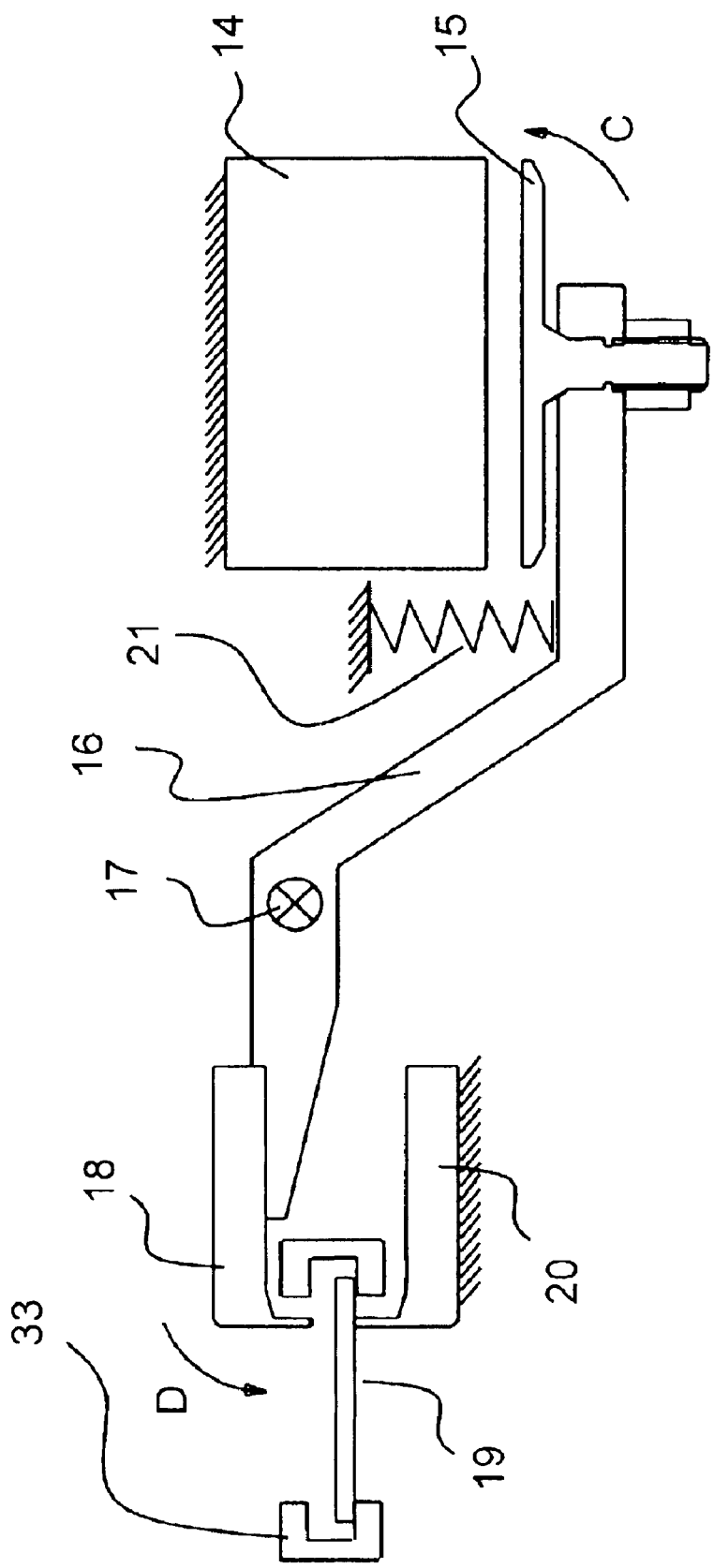
FIG. 1 shows a schematic structure of a prior art clamp apparatus.

The prior art clamp apparatus according to FIG. 1 needs to use a fairly stiff return spring 21 for quick passive de-clamping. So a substantial part of the solenoid force is consumed in overcoming the spring force. In the clamping mechanism of the invention, ideally speaking, no return spring 21 is required as the VCM 35 is adequately designed for quick response, both during clamping and de-clamping.

The magnetic circuit of the clamp apparatus according to the preferred embodiment also incorporates a feature, which generates an asymmetric force characteristic with respect to the direction of an energizing current. While affording a high specific clamping force, this design concept facilitates active de-clamping using the VCM 35.

The structure and function of the actuation system will now be described with reference to FIGS. 2, 3 and 4. A housing 1, typically made of soft magnetic material, houses the actuation system and forms part of a magnetic circuit. An exemplary embodiment of the linear induction actuator will first be discussed. A multiplicity of permanent magnets 2, which may each be shaped as a circular arc is mounted on the inner cylindrical surface of the housing 1. An annular air gap 10 formed between the inner cylindrical portion of the housing 1 and the magnets 2, contains a radial magnetic field. Disposed in the air gap 10 is a cylindrical voice coil 3–3'. The voice coil 3–3' is mounted on a coil support 4, which in turn, is affixed to a central shaft 5. The shaft 5 is allowed to freely move through a certain distance in the axial direction. It is guided by a snugly fitting self-lubricating bush bearing 6, which is affixed to the housing 1. When the voice coil 3–3' is energized by an electric current, the shaft 5 experiences an axial force due to electromagnetic induction between the voice coil 3–3' and magnets 2, whose magnitude is proportional to the current passing through the voice coil 3–3'. Reversing the direction of the coil current reverses the direction of the induced force.

An exemplary variable reluctance actuator is discussed next. At the bottom of the housing 1 is affixed another ring-shaped coil, called a solenoid coil 7–7'. The voice coil 3–3' and the solenoid coil 7–7' are connected electrically in anti-series. This means that when a current passes through the voice coil 3–3' in a clockwise direction as seen from the top of FIG. 2, the same current passes through the solenoid coil 7–7' in the counter-clockwise direction, as seen from the top of FIG. 2, and vice versa. A solenoid plate 8, typically made of soft magnetic material is affixed to the lower end of the shaft 5, such that when the solenoid coil 7–7' is energized by an electric current, the solenoid plate 8 is attracted towards the lower face of the housing 1.

Figure 3A:
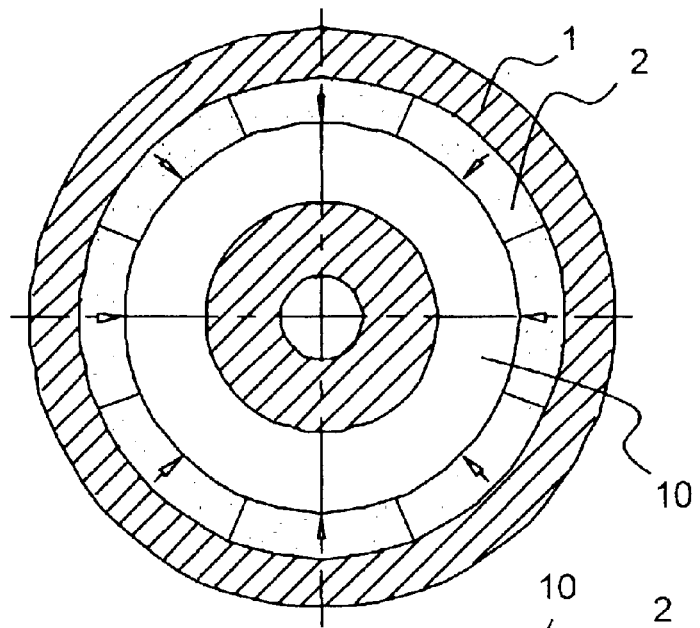
FIGS. 3a, 3b and 3c show respectively, plan, elevation and bottom views of a housing and magnets of a clamp actuator, all in cross-section.
Figure 3B:
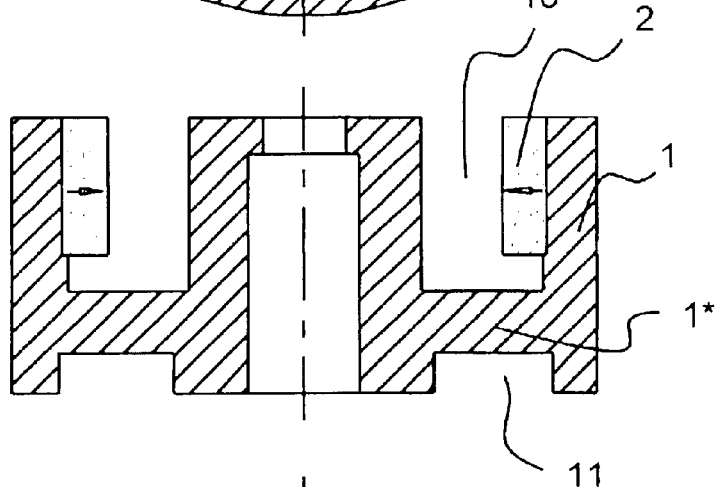
Figure 3C:
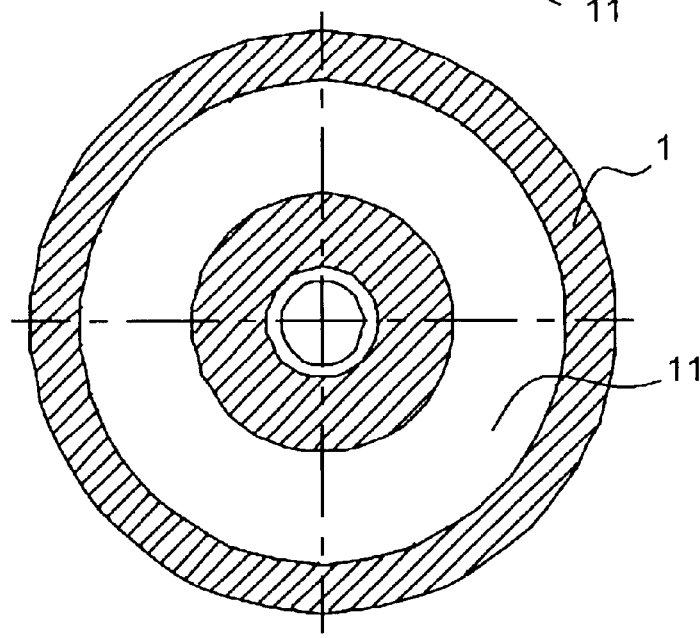

FIGS. 3a, 3b and 3c show respectively, plan, elevation and bottom views of the housing 1 and permanent magnets 2 of the clamp actuator, all in cross section. They illustrate the housing 1, that has a flux relay portion or section 1* dividing compartments containing the voice coil 3–3' and solenoid coil 7–7' respectively. There is an annular air gap 10 between the voice coil 3–3' and housing 1, and a void 11 in which the solenoid coil 7–7' is contained.

Figure 4B:
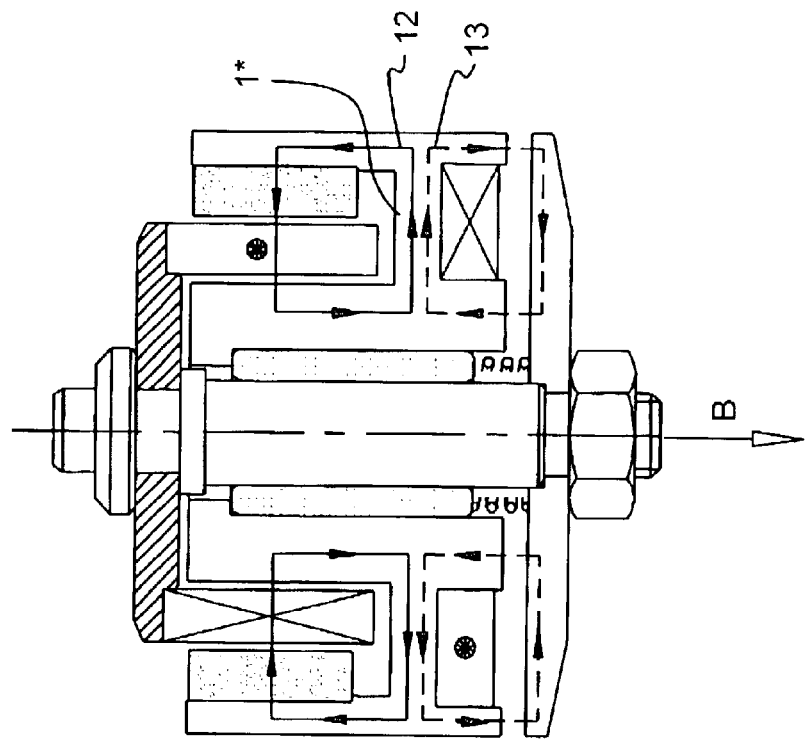
FIGS. 4a and 4b illustrate magnetic flux paths of the actuator during actuation for clamping and de-clamping respectively
Figure 4A:
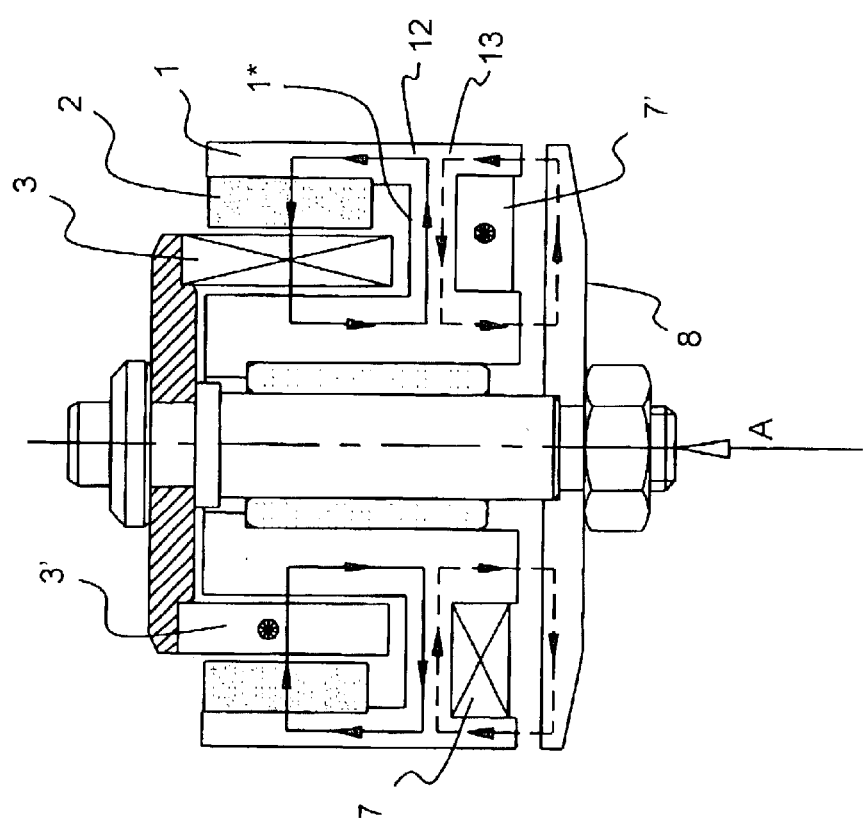

FIG. 4a shows the flux paths 12 and 13 of the VCM magnets 2 and the solenoid coil 7–7' respectively, during a clamping process. FIG. 4b shows the flux paths 12, 13 during de-clamping. The direction of magnetic flux 12 due to the permanent magnets 2 is fixed but the direction of the magnetic flux 13 due to the solenoid coil 7–7' reverses depending upon the reversal of the excitation current. During clamping, the current in the solenoid coil 7–7' flows as indicated in FIG. 4a, and thus the magnetic flux 13 due to the solenoid coil 7–7' flowing in section 1* of the housing 1 has a direction opposite to the magnetic flux 12 of the permanent magnets 2. Now section 1* of the housing 1 is so designed that it is very close to saturation solely due to the flux 12 of the permanent magnets 2. The flux 13 formed by the current in the solenoid coil 7–7' partially cancels out the flux 12, thus reducing the net flux density in section 1* and taking it away from flux saturation. Due to the current flow as shown in FIG. 4a, the voice coil 3–3' exerts a force on the shaft 5 in the upward direction as shown by arrow A. As the shaft 5 moves upward taking the solenoid plate 8 with it, an increasingly higher force is further exerted on the shaft 5 due to solenoid plate 8, which is strongly attracted by solenoid flux 13 at the bottom surface of the housing 1, as it approaches the latter. The final solenoid force is substantially higher than that of the VCM 35. During clamping action, although both forces act in tandem, the contribution of the solenoid 34 to the total force is substantially higher than that of the VCM 35.

When the direction of the excitation current is reversed as shown in FIG. 4b, the magnetic flux 13 of the solenoid coil 7–7' also reverses direction such that it now travels through section 1*, in the same direction as the flux 12 of the permanent magnets 2. However, as previously mentioned, section 1* of the housing 1 is very close to saturation solely on account of the flux 12 of the permanent magnets 2. Thus it can relay virtually no more flux arising from the solenoid coil 7–7'. Thus in this case, the attractive force exerted by the solenoid coil 7–7' on the solenoid plate 8 is small and so the predominant force is generated by the voice coil 3–3' in the downward direction as shown by arrow B. This is utilized to produce the de-clamping action.

The structure and function of the entire clamp apparatus is now described with reference to FIG. 2, which shows the structure of the whole clamp apparatus. In the unclamped state, an object such as a substrate 26 is supported by channel 33. In the preferred embodiment, clamping of the substrate 26 by a clamping mechanism, which may comprise an upper jaw 25 (mounted on lever 22) and a lower jaw 27 (mounted on lever 28), is effected by generating an actuation force on a force transmission mechanism, to transfer the force from the actuation system to the clamping mechanism. The force transmission mechanism may take the form of transferring the actuation force by rotationally actuating levers 22 and 28 respectively about pivots 23 and 31, in the directions indicated respectively by arrows G and H of FIG. 2.

The lever 22 is connected to the clamp shaft 5 through spring means, which may comprise a helical spring 9. The spring 9 ensures decoupling of the linear motion of the shaft from the rotary motion of the lever 22 about pivot 23. The spring 9 also ensures that irrespective of the substrate thickness clamped, the solenoid plate 8 travels its full distance towards the solenoid housing 1, thus enabling maximum possible force of the solenoid 7–7' on the solenoid plate 8. In effect, the clamp apparatus exerts its force on lever 22 through spring 9. The presence of spring 9 also ensures that the clamping force is higher for thicker substrates and lower for thinner substrates.

As described above, during clamping, the voice coil 3–3' initiates the motion of the shaft 5 in the direction of arrow A (FIG. 4a) and subsequently, the solenoid 34 also exerts an increasingly higher force on the shaft 5 in the same direction. As the shaft 5 moves in direction A, rotating the lever 22 about the pivot 23, a cam mechanism such as a cam plunger 30 which is preloaded against lever 22 by spring 29, moves in direction F through support bearing 32. In doing so, inclined surface 30' of the plunger 30 rotates the lever 28 about pivot 31, in the direction indicated by arrow H, until the lever 28 rests on the horizontal surface 30" of the plunger 30. As the lever 28 so rotates, the lower jaw 27 comes in contact with the substrate from below and lifts the substrate through a small height, from its support channel 33. The rotation of lever 22 about pivot 23 in the direction of arrow G brings the upper jaw 25 in contact with the substrate 26 from above. This results in the substrate 26 being clamped between jaws 25 and 27. After clamping, the substrate 26 is indexed precisely through a specified distance in a direction perpendicular to the plane of FIG. 2. Then, de-clamping is effected by reversing the current in the voice coil 3–3' and solenoid coil 7–7'. Upon current reversal, the solenoid 34 is ineffective due to magnetic saturation effect as explained previously. So the force of the VCM 35 turns the lever 22 in the direction opposite to E, raising the upper jaw 25 in a direction opposite to arrow G. At the same time, turning of the lever 22 also pushes the cam plunger 30 in the direction opposite to direction F, thus allowing the lever 28 aided by light spring 24, to rotate in a direction opposite to direction H, while sliding down surface 30' of plunger 30, thus de-clamping the substrate 26.

An indexing actuator (not shown) then returns the open clamping mechanism to the initial position for the next indexing stroke. After de-clamping, the substrate 26 lies in the support channel 33 without any contact from the clamping jaws 25 and 27. So during the return stroke of the indexing actuator, the position of the substrate 26 is not disturbed by the jaws 25, 27. Hence the substrate may be supported solely by the support channel 33 and its position is maintained without a need to use any other fixed clamp to maintain the precise position of the substrate 26 in the channel 33, as the index clamp returns to its initial position for the next indexing stroke.

Thus, it will be appreciated that the preferred embodiment of the invention employs both a solenoid and a voice coil motor (VCM) for its clamping action. Such hybrid actuation enables better control over the impact force during clamping. It also results in a clamp with an extended range attainable by a combination of both actuation means, as well as moderation of clamping force and can handle more types of substrate thickness.

Further, the presence of the voice coil motor 35 affords the clamp apparatus a greater flexibility through profiling of the actuating current. Current profiling involves a stepwise increase in current leading to a gradual, smoother motion of the clamp jaws thus enabling clamping of the substrate 26 with minimal impact force. Current profiling, although possible with a simple solenoid clamp of the prior art, lends limited advantage due to the highly non-linear variation of force with solenoid gap.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for clamping an object, comprising a clamping mechanism and an actuation system to actuate clamping and de-clamping of the clamping mechanism, wherein the actuation system comprises two actuator devices which are operatively coupled whereby to provide an actuation force to the clamping mechanism, wherein the two actuator devices respectively comprise a variable reluctance actuator and a linear induction actuator coupled together and adapted to cooperate to provide the actuation force to the clamping mechanism.

2. An apparatus according to claim 1, wherein the variable reluctance actuator is capable of generating a relatively higher actuation force and the linear induction actuator is capable of generating a relatively more consistent actuation force.

3. An apparatus according to claim 1, wherein the actuation system is housed within a housing made of soft magnetic material.

4. An apparatus according to claim 3, wherein the variable reluctance actuator comprises a solenoid coil mounted inside a compartment of the housing, such that the housing relays magnetic flux from the solenoid coil.

5. An apparatus according to claim 3, wherein the housing includes a flux relay portion which is designed to be close to magnetic flux saturation and the flux relay portion is adapted to relay virtually no flux arising from the solenoid coil during de-clamping of the clamping mechanism.

6. An apparatus according to claim 1, wherein the linear induction actuator comprises one or more coils for carrying a current, which coils are disposed and moveable by electromagnetic induction within an air gap located adjacent to a permanent magnet.

7. An apparatus according to claim 6, including a force transmission mechanism operative to actuate movement of the clamping mechanism when the coil moves.

8. An apparatus according to claim 1, wherein the variable reluctance actuator and linear induction actuator are connected electrically in anti-series.

9. An apparatus according to claim 1, wherein the clamping mechanism comprises a pair of clamping jaws.

10. An apparatus according to claim 9, wherein both clamping jaws are adapted to be actuated during clamping and de-clamping.

11. An apparatus according to claim 9, including force transmission means connecting the actuation system and at least one jaw of the clamping mechanism by a lever mechanism.

12. An apparatus according to claim 9, including force transmission means connecting the actuation system and at least one jaw of the clamping mechanism by a cam mechanism which is responsive to an actuation force from the actuation system.

13. An apparatus according to claim 1, including a support channel adapted to solely support the object when the object is de-clamped and the clamping mechanism is being re-positioned.

14. An apparatus according to claim 1, including spring means to bias the clamping mechanism through a force transmission means to increase clamping force on the object.

15. An apparatus according to claim 1, wherein the object is a semiconductor substrate.

16. An apparatus according to claim 15, wherein the clamping mechanism is part of an indexing system of a wire-bonding machine.

* * * * *